United States Patent [19]
Chang et al.

[11] Patent Number: 6,110,768
[45] Date of Patent: Aug. 29, 2000

[54] METHOD OF MANUFACTURING ALUMINUM GATE ELECTRODE

[75] Inventors: Ting-Chang Chang, Hsinchu; Du-Zen Peng, Chu-Pei; Po-Sheng Shih, Hsinchu, all of Taiwan

[73] Assignee: United Microelectronics Corp., Hsinchu, Taiwan

[21] Appl. No.: 09/262,234

[22] Filed: Mar. 4, 1999

[51] Int. Cl.[7] .................................................. H01L 21/00
[52] U.S. Cl. ............................................ 438/158; 438/584
[58] Field of Search ..................................... 438/149, 158, 438/584, 588, FOR 183

[56] References Cited

U.S. PATENT DOCUMENTS 5,612,250  3/1997  Ohtani et al. .
6,028,011  2/2000  Takase et al. .

OTHER PUBLICATIONS

H. Sirringhaus, Self–Passivated Copper Gates for Amorphous Silicon TFTs, (IEEE), pp. 388–390, 1997.

Primary Examiner—Charles Bowers
Assistant Examiner—Scott J Hawranek
Attorney, Agent, or Firm—Thomas, Kayden, Horstemeyer & Risley

[57] ABSTRACT

A method of manufacturing a method of manufacturing a thin film transistor. An aluminum gate electrode is formed on a substrate. A protective layer is formed on the top surface and the sidewall of the aluminum gate electrode. A gate dielectric layer is formed on the substrate and the protective layer. An intrinsic amorphous-silicon thin film is formed on the gate dielectric layer. A heavily doped amorphous-silicon thin film is formed on the intrinsic amorphous-silicon thin film. A patterned source/drain conductive layer is formed on the heavily doped amorphous-silicon thin film to expose a portion of the heavily doped amorphous-silicon thin film. The portion of the heavily doped amorphous-silicon thin film exposed by the patterned source/drain conductive layer is removed to expose a portion of the intrinsic amorphous-silicon thin film.

8 Claims, 2 Drawing Sheets

METHOD OF MANUFACTURING ALUMINUM GATE ELECTRODE

BACKGROUND OF THE INVENTION

1. Field of the Invention

The present invention relates to a method of manufacturing a semiconductor device. More particularly, the present invention relates to a method of manufacturing an aluminum gate electrode of a thin film transistor.

2. Description of the Related Art

Typically, an amorphous silicon thin film transistor is used as a switch device for an active matrix liquid crystal display (LCD) since the advantages of the amorphous silicon include low temperature deposition, low cost, less leakage current and large area production. However, the quality of the amorphous silicon thin film transistor becomes poorer because the aluminum gate electrode of the amorphous silicon thin film transistor protuberates when the temperature is raised, to manifest a hillock effect.

Since the difference between the thermal expansion coefficient of the aluminum electrode and that of insulating layer of the substrate is very large, the stress of the aluminum electrode is different from that of the insulating layer of the substrate when the temperature is raised. Moreover, because of the low melting point of aluminum, the vacancy of the aluminum electrode rapidly diffuses to release the stress in the aluminum electrode as the temperature rises. Therefore, the aluminum electrode protuberates when the temperature is high.

Commonly, the ways to constrict the hillock effect includes the following methods:

1. A metal layer such as a tungsten layer or a titanium layer deposited on the aluminum electrode is used to inhibit the hillock effect ill a direction vertical to the substrate surface. However, the aluminum electrode then laterally protuberates. Because of the laterally protuberating aluminum, the aluminum electrode electrically couples to the adjacent devices when the size of the devices and the spaces between devices become smaller.

2. Several elements are added into the aluminum electrode, in an amount larger than the maximum solid solubility of the aluminum to produce additional precipitation at the grain boundary. Since the education can avoid the vacancy diffusion, the hillock. effect can be avoided. But this method cannot effectively inhibit the hillock effect. Incidentally, the education easily diffuses into the gate dielectric layer when the temperature lowers rapidly Therefore, the quality of the gate dielectric layer worsens.

3. Silicon elements are added into the aluminum electrode and then a titanium layer is formed on the aluminum electrode. Although the hillock effect can be avoided, the operation rate of the devices becomes slow since the resistance of the aluminum electrode having the dopants of the silicon elements is very large.

SUMMARY OF THE INVENTION

The invention provides a method of manufacturing an aluminum gate electrode of a thin film transistor. By using the invention, the hillock effect is efficiently inhibited and the low resistance of the aluminum gate electrode can be maintained. Moreover, the process procedure according to the invention is simple and the cost can be reduced.

To achieve these and other advantages and in accordance with the purpose of the invention, as embodied and broadly described herein, the invention provides a method of manufacturing a thin film transistor. A substrate is provided. An aluminum gate electrode is formed on the substrate. A protective layer is formed on a top surface and a sidewall of the aluminum gate electrode. A gate dielectric layer is formed on the substrate and the protective layer. An intrinsic amorphous-silicon thin film is formed on the gate dielectric layer. A heavily doped amorphous-silicon thin film with high concentration dopants is formed on the intrinsic amorphous-silicon thin film. A patterned source/drain conductive layer is formed on the heavily doped amorphous-silicon thin film to expose a portion of the heavily doped amorphous-silicon thin film above the aluminum gate electrode. The portion of the heavily doped amorphous-silicon thin film exposed by the patterned source/drain conductive layer is removed to expose a portion of the intrinsic amorphous-silicon thin film. Since the protective layer is formed on the top surface and the sidewall of the aluminum gate electrode, the hillock effect is efficiently inhibited and the low resistance of the aluminum gate electrode can be maintained. Additionally, the process procedure according to the invention is simple and the cost can be reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
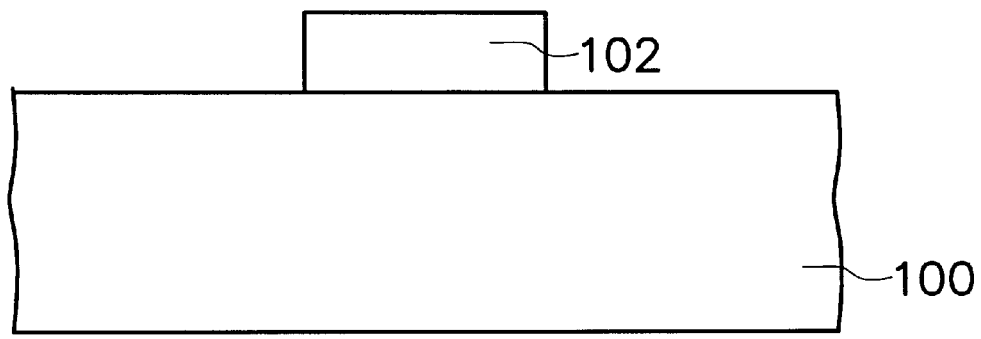
FIGS. 1A through 1E are schematic, cross-sectional views of the process for manufacturing an aluminum gate of the thin film transistor in a preferred embodiment according to the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1E are schematic, cross-sectional views of the process for manufacturing an aluminum gate of the thin film transistor in a preferred embodiment according to the invention.

As shown in FIG. 1A, an aluminum gate electrode 102 is formed on the substrate 100. In this example, the method of forming the aluminum gate electrode 102 comprises the steps of forming an aluminum layer (not shown) is formed on the substrate 100. The aluminum layer is patterned to form the aluminum gate electrode 102.

Figure 1B:
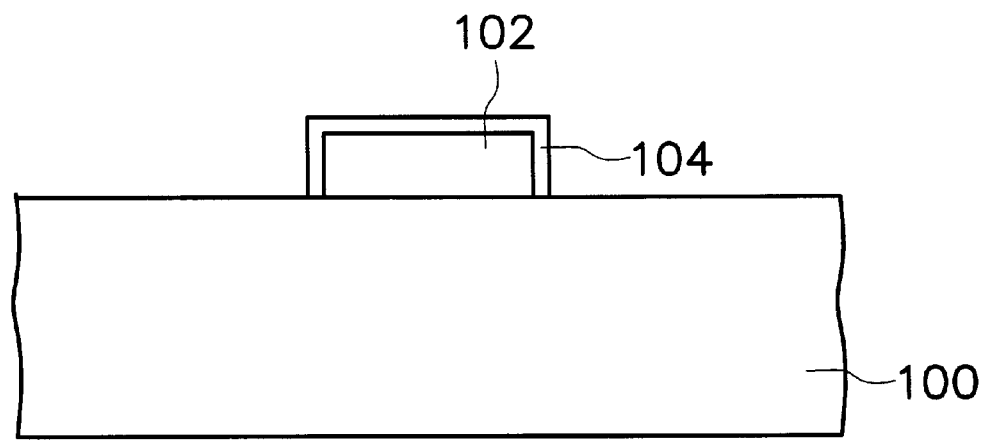

As shown in FIG. 1B, a protective layer 104 is formed on the top surface and the sidewall of the aluminum gate electrode 102. In this example, the method for forming the protective layer 104 comprises the step of dipping the substrate 100 and the aluminum gate electrode 102 in a noble metal contained solution, wherein the activity of the noble metal is lower than that of the aluminum. The displacement reaction of the aluminum gate electrode 102 and the noble metal occurs to form the protective layer 104 on the top surface and the sidewall of the aluminum gate electrode 102. The noble metal contained solution can be copper sulfate ($CuSO_4$) solution, silver nitrate ($AgNO_3$) solution or palladium chloride ($PdCl_2$) solution, for example. The condition for forming the-protective layer 104 is a temperature of about 20–50° C., and the noble solution is an acidic solution. The protective layer 104 is formed by dipping the substrate 100 and the aluminum gate electrode 102 in the noble solution, where the concentration of the noble metal in the noble solution is about 0.05–0.5 mole/l for about 3–10 minutes. The protective layer 104 can prevent the aluminum gate electrode 102 from manifesting the hillock effect seen in the subsequent process.

Figure 1C:
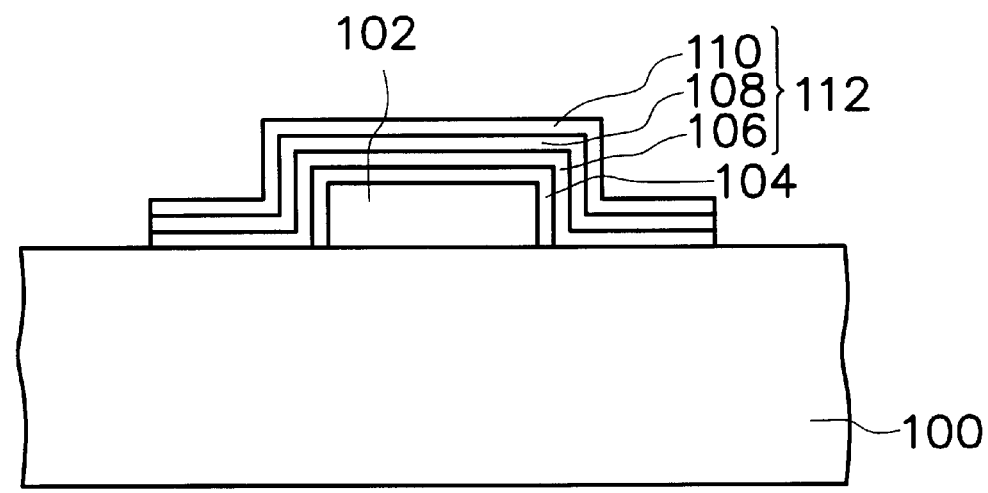

As shown in FIG. 1C, a gate dielectric layer 106, an intrinsic amorphous-silicon thin film 108 and a heavily doped amorphous-silicon thin film 110 are formed on the substrate 100 and the aluminum gate electrode 102 in sequence. A portion of the gate dielectric layer 106, the intrinsic amorphous-silicon thin film 108 and the heavily doped amorphous-silicon thin film 110 are removed to expose the surface of the substrate 100. The remaining the gate dielectric layer 106, the intrinsic amorphous-silicon thin film 108 and the heavily doped amorphous-silicon thin film 110 together compose a covering layer 112. The gate dielectric layer 106 can be a silicon nitride layer, for example. The dopants in the heavily doped amorphous-silicon thin film 110 can be N-type ions, for example.

Figure 1D:
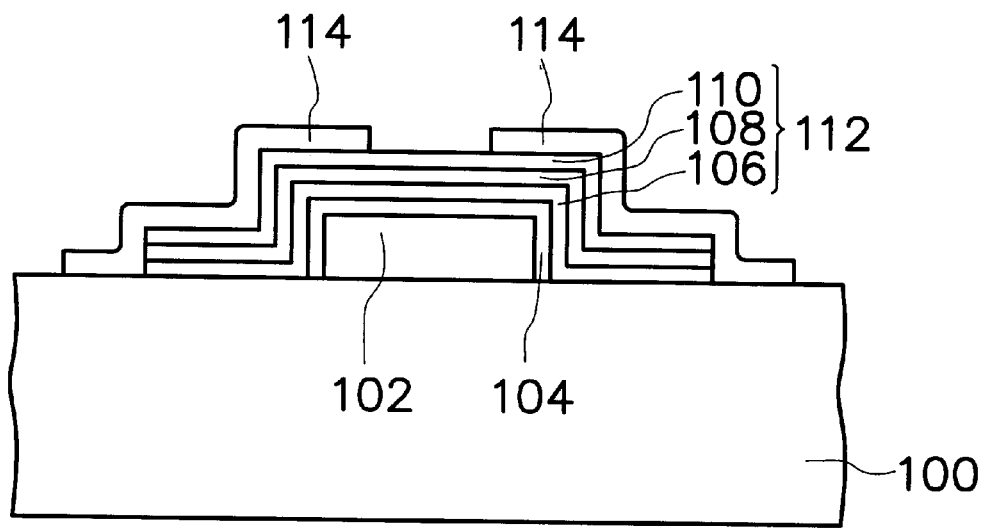

As shown in FIG. 1D, a patterned source/drain conductive layer 114 is formed on the substrate 100 and the covering layer 112 to expose a portion of the substrate 100 and the covering layer 112. The portion of the covering layer 112 exposed by the source/drain conductive layer 114 is above the aluminum gate electrode 102. In this example, the method of forming the patterned source/drain conductive layer 114 comprises the steps of forming a conformal metal layer, such as an aluminum layer, on the covering layer 112. The conformal metal layer is patterned to form the patterned source/drain conductive layer 114 and expose a portion of the substrate 100 and the heavily doped amorphous-silicon thin film 110.

Figure 1E:
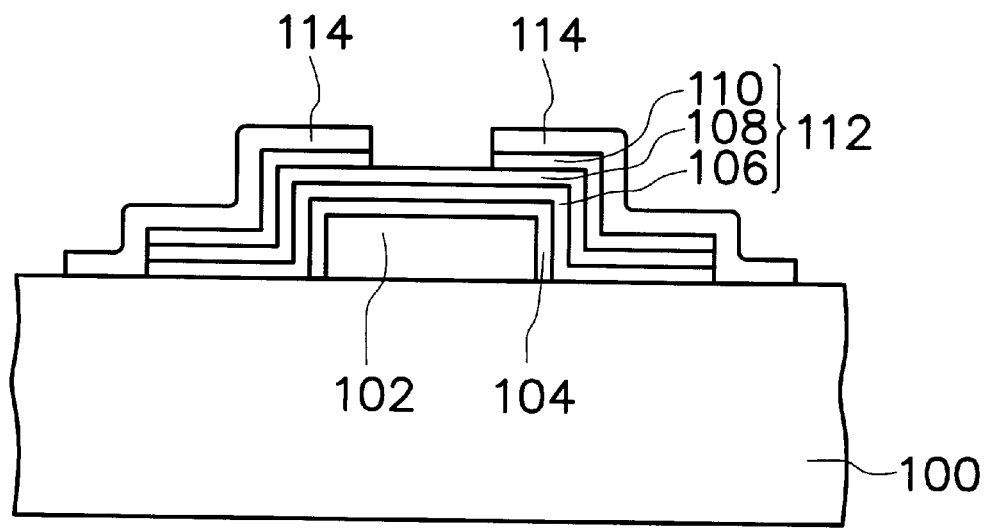

As shown in FIG. 1E, the portion of the heavily doped amorphous-silicon thin film 110 exposed by the patterned source/drain conductive layer 114 is removed to expose the intrinsic amorphous-silicon thin film 108. The method of removing the portion of the heavily doped amorphous-silicon thin film 110 includes anisotropic etching with the patterned source/drain conductive layer 114 serving as a etching mask, for example.

In the invention, the protective layer is formed on the top surface and the sidewall of the aluminum gate electrode by dipping the substrate having an aluminum gate electrode formed thereon in a noble metal contained solution. The hillock effect caused by the large difference of the thermal expansion coefficient between the aluminum gate electrode and the substrate and the vacancy diffusion can be avoided. By forming the protective layer, the aluminum gate electrode does not electrically couple to the adjacent devices and the low resistance of the aluminum gate electrode can be maintained. Additionally, the process procedure according to the invention is simple and the cost can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a thin film transistor, comprising the steps of:

providing a substrate;

forming a protective layer on a top surface and a sidewall of the aluminum gate electrode;

wherein the step of forming the protective layer further comprises the step of dipping the substrate and the aluminum gate electrode in a noble metal contained solution to form the protective layer;

forming a gate dielectric layer on the substrate and the protective layer;

forming an intrinsic amorphous-silicon thin film on the gate dielectric layer;

forming an heavily doped amorphous-silicon thin film on the intrinsic amorphous-silicon thin film;

forming a patterned source/drain conductive layer on the heavily doped amorphous-silicon thin film to expose a portion of the heavily doped amorphous-silicon thin film above the aluminum gate electrode; and removing the portion of the heavily doped amorphous-silicon thin film exposed by the patterned source/drain conductive layer to expose a portion of the intrinsic amorphous-silicon thin film.

2. The method of claim 1, wherein a activity of the noble metal in the noble metal contained solution is lower than the activity of the aluminum gate electrode.

3. The method of claim 1, wherein the noble metal includes silver.

4. The method of claim 1, wherein the noble metal includes palladium.

5. The method of claim 1, wherein the substrate and the aluminum gate electrode are dipped in the noble metal contained solution at a temperature about 20–50° C. for 3–10 minutes, wherein the noble metal contained solution is an acidic solution.

6. The method of claim 5, wherein the concentration of the noble metal in the noble metal contained solution is about 0.05–0.5 mole/l.

7. The method of claim 1, wherein material of the source/drain conductive layer includes aluminum.

8. The method of claim 1, wherein the method of removing the portion of the heavily doped amorphous-silicon thin film includes anisotropic etching with the source/drain conductive layer serving as an etching mask.

* * * * *